United States Patent
Ogimoto

(10) Patent No.: US 8,871,364 B2
(45) Date of Patent: *Oct. 28, 2014

(54) PEROVSKITE MANGANESE OXIDE THIN FILM

(75) Inventor: Yasushi Ogimoto, Higashiyamoto (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/817,125

(22) PCT Filed: Nov. 28, 2011

(86) PCT No.: PCT/JP2011/077355
§ 371 (c)(1),
(2), (4) Date: Feb. 14, 2013

(87) PCT Pub. No.: WO2012/077517
PCT Pub. Date: Jun. 14, 2012

(65) Prior Publication Data
US 2013/0149556 A1  Jun. 13, 2013

(30) Foreign Application Priority Data

Dec. 9, 2010 (JP) .................. 2010-274169

(51) Int. Cl.
| | |
|---|---|
| *H01F 1/01* | (2006.01) |
| *G02B 1/10* | (2006.01) |
| *H01L 45/00* | (2006.01) |
| *H01L 43/10* | (2006.01) |
| *C30B 23/06* | (2006.01) |
| *C30B 29/22* | (2006.01) |

(52) U.S. Cl.
CPC .............. *H01F 1/01* (2013.01); *H01L 45/1625* (2013.01); *H01L 43/10* (2013.01); *C30B 23/066* (2013.01); *C30B 29/22* (2013.01); *G02B 1/10* (2013.01); *H01L 45/147* (2013.01); *H01L 45/04* (2013.01)
USPC ........... 428/702; 428/700; 252/583; 252/582; 252/62.51 R

(58) Field of Classification Search
None
See application file for complete search history.

(56) References Cited

U.S. PATENT DOCUMENTS

| | | | |
|---|---|---|---|
| 5,665,664 A | 9/1997 | Tomioka et al. | |
| 6,136,457 A | 10/2000 | Miyano et al. | |

(Continued)

FOREIGN PATENT DOCUMENTS

| | | |
|---|---|---|
| EP | 0864538 A1 | 9/1998 |
| JP | 08-133894 A | 5/1996 |

(Continued)

OTHER PUBLICATIONS

Zhao et al., Photo-induced voltage characteristics of $_{La0.9}Sr_{0.1}MnO_3$ films epitaxially grown on vicinal $SrTiO_3(001)$ substrates, journal of Physics D: Applied Physics, 2007, vol. 40, p. 5703- 5706.

(Continued)

*Primary Examiner* — David Sample
(74) *Attorney, Agent, or Firm* — Rabin & Berdo, P.C.

(57) ABSTRACT

An article including a perovskite manganese oxide thin film is composed of a substrate; and a perovskite manganese oxide thin film formed on the substrate and having an orientation that is an (m10) orientation where 19≥m≥2. When m is 2 the perovskite manganese oxide thin film has a (210) orientation. The invention provides a perovskite manganese oxide thin film having a transition temperature at room temperature or above, which is higher than that of the bulk oxide, by exploiting the substrate strain and the symmetry of the crystal lattice.

20 Claims, 16 Drawing Sheets

(56) References Cited

U.S. PATENT DOCUMENTS

| | | | |
|---|---|---|---|
| 7,083,270 B2 * | 8/2006 | Torii et al. | 347/68 |
| 8,524,382 B2 * | 9/2013 | Ogimoto | 428/700 |
| 2005/0040482 A1 * | 2/2005 | Suzuki et al. | 257/411 |
| 2008/0217622 A1 * | 9/2008 | Goyal | 257/64 |
| 2009/0230211 A1 * | 9/2009 | Kobayashi et al. | 239/102.2 |
| 2011/0216130 A1 * | 9/2011 | Hamada | 347/68 |
| 2011/0216134 A1 * | 9/2011 | Hamada | 347/71 |
| 2013/0140661 A1 * | 6/2013 | Ogimoto | 257/421 |
| 2013/0149556 A1 * | 6/2013 | Ogimoto | 428/700 |
| 2013/0189542 A1 * | 7/2013 | Ogimoto | 428/701 |
| 2013/0200457 A1 * | 8/2013 | Ogimoto | 257/347 |

FOREIGN PATENT DOCUMENTS

| | | |
|---|---|---|
| JP | 10-255481 A | 9/1998 |
| JP | 10-261291 A | 9/1998 |
| JP | 2001-122698 A | 5/2001 |
| JP | 2001-278700 A | 10/2001 |
| JP | 2005-213078 A | 8/2005 |

OTHER PUBLICATIONS

Zhuo et al., Single [101]-oriented growth of $La_{0.9}Sr_{0.1}MnO_3$ films on vicinal $SrTiO_3$(001) substrates, Applied Physics Letters, 2006, vol. 88, p. 071905-1~071905-3.

Jin et al.: "Transport and photoinduced properties in $La_{0.8}Sn_{0.2}MnO_3$ thin film", Journal of Alloys and Compounds, Elsevier Sequoia, Lausanne, CH, vol. 470, No. 1-2, Feb. 20, 2009, pp. 552-556, XP025913195.

Ogimito et al.: "Strain-induced crossover of the metal-insulator transition in perovskite manganites", Physical Review B, vol. 71, 060403, Feb. 16, 2005, pp. 1-4, XP002723197.

Nakamura et al.: "Phase control through anisotropic strain in $Nd_{0.5}Sr_{0.5}MnO_3$ thin films", Applied Physics Letters, vol. 86, 182504, Apr. 27, 2005, pp. 1-3, XP002723198.

Chopdekar et al.: "Orientation and thickness dependence of magnetization at the interfaces of highly spin-polarized manganite thin films", Physical Review B, vol. 79, 104417, Mar. 17, 2009, pp. 1-7, XP002723199.

* cited by examiner

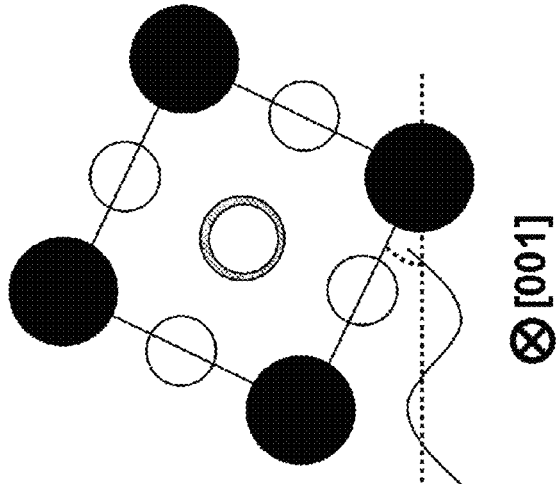
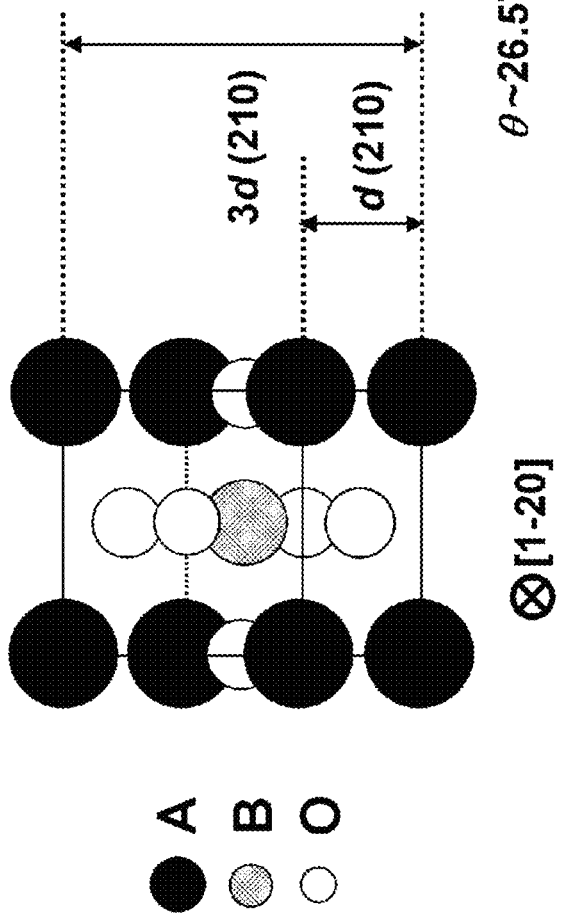

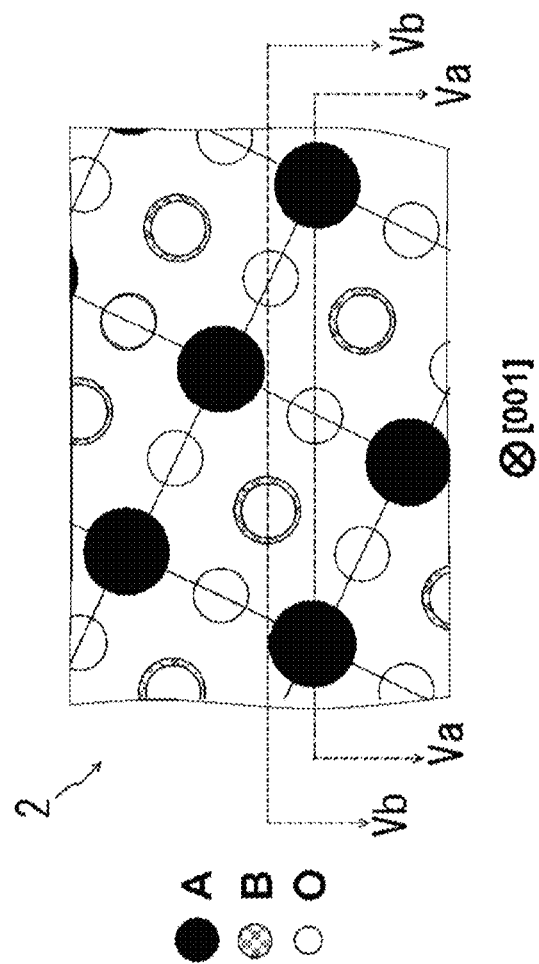

PEROVSKITE MANGANESE OXIDE THIN FILM

CROSS-REFERENCE TO RELATED APPLICATIONS

This non-provisional Application is the U.S. National Stage Application of PCT/JP2011/077355 and is related to Japanese Laid-Open Application 2010-274169 filed Dec. 9, 2010, priority of which is claimed.

BACKGROUND OF THE INVENTION

1. Field of the Invention

The present invention relates to a perovskite manganese oxide thin film. More specifically, the present invention relates to a perovskite manganese oxide thin film the electrical, magnetic or optical properties of which are switched in response to a stimulus such as temperature, electrical field, magnetic field or light exposure.

2. Background of the Related Art

There has been concern in recent years that semiconductor devices may be facing the limits of the scaling law, which has been a guiding principle of performance advances in the field. In this context, materials are being developed that will make possible new operating principles in order to weather the crisis when the transistor limit is reached. For example, in the field of spintronics, which exploits the spin degrees of freedom of electrons, there has been development aimed at high-density non-volatile memories capable of high-speed operation at the same level as DRAM (dynamic random access memory).

There has also been progress in research into materials having strongly correlated electron systems that cannot be described in terms of band theory, which is the cornerstone of semiconductor device design. Substances have been discovered that exhibit very large and rapid changes in physical properties caused by phase changes in the electron system. In strongly correlated electron system materials, a variety of electron phases with a variety of orders formed by spins, charges and orbitals are possible because the phase state of the electron system is affected not only by the spin degrees of the freedom but also by the degrees of freedom of the electron orbitals. Typical examples of strongly correlated electron system materials are the perovskite manganese oxides, in which a first order phase transition produces a charge-ordered phase by alignment of 3d electrons of manganese (Mn) and an orbital-ordered phase by alignment of the electron orbitals.

In a charge-ordered phase or orbital-ordered phase, electrical resistance increases because the carrier is localized, and the electron phase becomes an insulator phase. The magnetic behavior of this electron phase is that of an antiferromagnetic phase due to the double exchange interactions. The electron states of the charge-ordered phase and orbital-ordered phase should often be regarded as semiconductor states. This is because although the carrier is localized in the charge-ordered phase and orbital-ordered phase, the electrical resistance is lower than that of a so-called band insulator. In accordance with convention, however, the electron phases of the charge-ordered phase and orbital-ordered phase are here called insulator phases. Conversely, when the behavior is metallic with low resistance, the electron phase is a ferromagnetic phase because the spins are aligned. The term "metallic phase" is defined in various ways, but here a metallic phase is one in which "the temperature derivative of resistivity is positively signed". Expressed in this way, the aforementioned insulator phase can be re-defined as one in which "the temperature derivative of resistivity is negative".

A variety of switching phenomena have reportedly been observed in bulk single-crystal materials made of substances capable of assuming either the aforementioned charge-ordered phase or orbital-ordered phase, or a phase that combines both a charge-ordered phase and an orbital-ordered phase (charge- and orbital-ordered phase), see Japanese Patent Application Publication Nos. H08-133894, H10-255481, and H10-261291. These switching phenomena occur in response to applied stimuli, namely, temperature changes around the transition point, application of a magnetic or electric field, or light exposure. These switching phenomena are typically observed as very large changes in electrical resistance and antiferromagnetic-ferromagnetic phase transitions. For example, resistance changes by orders of magnitude in response to application of a magnetic field are a well-known phenomenon called colossal magnetoresistance.

To achieve an electronic device, magnetic device or optical device or any kind of device using these effects, the switching phenomena must be manifested when the perovskite manganese oxide has been formed as a thin film. As in the case of an ordinary semiconductor device, a defect-free single-crystal thin film is necessary in order to achieve high-performance switching properties and uniform properties. There has therefore been much research using laser ablation methods, which allow the preparation of high-quality thin films of perovskite manganese oxides. Due to advances in film-fabrication technology, it is now possible to prepare perovskite manganese oxide thin films while controlling the atomic layers one by one by monitoring the intensity oscillation of the RHEED (reflection high-energy electron diffraction).

$SrTiO_3$ (lattice constant 0.3905 nm), LSAT (($LaAlO_3)_{0.3}$ ($SrAl_{0.5}Ta_{0.5}O_3)_{0.7}$, lattice constant 0.387 nm) and other cubic perovskite single crystals are often selected as substrates for preparing perovskite manganese oxide thin films, and a (100) orientation is often used as the substrate plane orientation. The reasons for selecting such substrates have to do with lattice constant mismatch between the substrate and the perovskite manganese oxide. However, the problem has been that even if a single-crystal thin film of a perovskite manganese oxide is prepared by deposition on such a (100) oriented substrate, the switching phenomena are not manifested in the resulting (100) oriented perovskite manganese oxide single-crystal thin film. This is because the in-plane lattice of the formed thin film is fixed to the in-plane lattice of the substrate, and the first order phase transition to a charge-ordered phase or orbital-ordered phase requires a kind of lattice deformation called Jahn-Teller deformation, which is suppressed by in-plane fourfold symmetry of the substrate.

On the other hand, Japanese Patent Application Publication No. 2005-213078 discloses a perovskite oxide thin film formed using a substrate with a (110) orientation. According to this disclosure, the formed thin film allows shear deformation of the crystal lattice during switching when the in-plane fourfold symmetry of the (110) oriented substrate is broken. That is, in a thin film formed in accordance with Japanese Patent Application Publication No, 2005-213078 the crystal lattice is oriented parallel to the substrate plane, while the charge-ordered plane or orbital-ordered plane is non-parallel to the substrate plane. As a result, first order phase transitions involving deformation of the crystal lattice are possible even with a single crystal thin film the in-plane crystal lattice of which is fixed to the in-plane lattice of the substrate. Thus, according to Patent Document 4, a transition or in other words a switching phenomenon at high temperatures equivalent to those obtained with the bulk single crystal can be achieved by using a (110) oriented substrate.

As discussed above, the operating principle of these switching phenomena is a phase transition of an electron phase, namely a charge-ordered phase or orbital-ordered phase. To achieve a highly practical electronic device using a perovskite manganese oxide, the transition temperature to the charge-ordered phase or orbital-ordered phase must be brought to near the normal operating temperature of the device, or more specifically to an absolute temperature of 300 K or more or in other words room temperature or above. However, in the examples disclosed by prior art, a major barrier to practical use has been that the switching phenomena are manifested at room temperature or below both with the bulk and thin-film form of the oxide.

SUMMARY OF THE INVENTION

In light of the problems described above, the present invention contributes to the preparation of various devices using perovskite manganese oxide thin films by providing a perovskite manganese oxide thin film exhibiting a transition temperature at room temperature or above.

Upon close examination of these issues with a focus on the orientation direction of the thin film, the inventor discovered that a perovskite manganese oxide thin film exhibiting a much higher transition temperature than the bulk oxide could be obtained by cleverly exploiting the substrate strain and the symmetry of the crystal lattice.

That is, a perovskite manganese oxide thin film formed on a substrate and having an (m10) orientation (19≥m≥2) is provided by one aspect of the present invention. This aspect provides an articles including a perovskite manganese oxide thin film, comprising a substrate; and a perovskite manganese oxide thin film formed on the substrate and having an orientation that is a (m10) orientation where 19≥m≥2.

With this configuration, a first order phase transition is made possible by breaking the in-plane symmetry, and the transition temperature can be elevated because of substrate strain.

An "(m10) orientation" here means the orientation of a crystal lattice (hereunder called an "orientation") formed so that the Miller index indicating the film surface or in other words the surface of the thin film parallel to the substrate plane is (m10). The orientation is (110) when m=1, meaning an orientation in which the (100) plane is inclined at an angle of 45 degrees around the [001] axis contained in that plane (in-plane [001] axis). The angle of the (100) plane relative to the thin film surface is determined by the following formula for ordinary values of m:

$$\theta = \arctan(1/m) \quad \text{(Formula 1)}.$$

For example, substituting m=1 into Formula 1 gives a value of 45 degrees for angle θ as described above, while substituting m=2 gives an angle of 26.56 degrees. Thus, as the integer m increases, the (100) plane in a thin film having an (m10) orientation becomes more nearly parallel to the thin film surface or substrate surface.

Thus, if m=19 for example in Formula 1 then angle θ is 3.013 degrees. Thus, a thin film surface can be described not only in terms of its plane index, but also in terms of angle θ. In this case, angle θ is also called the off angle especially when the incline of the substrate plane is slight. Naturally, the correspondence between this angle θ and the plane index is given by Formula 1. The upper limit of m works out to 19≥m. This upper limit for m is based on the fact that the off angle (angle θ) of the (100) plane should be larger than 3 degrees.

As mentioned with respect to prior art, a first order phase transition is possible at m=1, but as shown in the examples, the transition temperature is then similar to that of the bulk form. Therefore, the lower limit of m is 2. This is because it has been confirmed experimentally that the lattice deformation necessary for a first order phase transition is suppressed if the off angle is 3 degrees or less.

Moreover, m is preferably 2 in a perovskite manganese oxide thin film of this aspect of the present invention, giving a (210) orientation. This aspect provides an article including a perovskite manganese oxide thin film, comprising a substrate; and a perovskite manganese oxide thin film formed on the substrate and having an orientation that is a (210) orientation.

With this configuration, it is possible to achieve a first order phase transition by breaking the in-plane symmetry of the substrate, and more easily prepare a thin film with a higher transition temperature due to substrate strain. As discussed above, the (m10) plane is equivalent to the (100) plane inclined around the in-plane [001] axis so as to fulfill Formula 1. The lattice spacing along the plane of the thin film is affected by this inclination. Specifically, while the lattice spacing in the direction of the in-plane [001] axis is the same as with a (100) orientation, the lattice spacing along the direction of [1-m0] axis perpendicular to the in-plane [001] axis becomes greater as m increases. Consequently, as the value of m increases it becomes more difficult to specify the atomic positions, and crystal growth becomes more difficult. In addition, as m increases the spacing of the atomic layers becomes narrower in the direction perpendicular to the plane (the direction of thin film growth), and it becomes more difficult to specify the surface. For these reasons, the most desirable of the (m10) planes from the standpoint of thin film preparation is the (210) orientation, which has the smallest index.

Moreover, in a perovskite manganese oxide thin film of this aspect of the present invention, the perovskite manganese oxide thin film preferably exhibits a ferromagnetic metallic phase.

With this configuration, the ferromagnetic transition temperature ($T_c$) of the perovskite manganese oxide thin film of this aspect of the present invention can be increased above that of the bulk crystal.

In addition, the perovskite manganese oxide thin film of this aspect of the present invention is preferably characterized by orbital ordering of 3d electrons of the perovskite manganese oxide thin film. That is, the perovskite manganese oxide thin film has 3d electrons that are orbitally ordered.

With this configuration, the orbital ordering transition temperature ($T_\infty$) of the perovskite manganese oxide thin film of this aspect can be increased above that of the bulk crystal. The 3d electrons that are orbitally ordered are $e_g$ orbital electrons belonging to the $Mn^{3+}$ valence state as represented by nominal valence for example.

Moreover, the perovskite manganese oxide thin film of this aspect of the present invention is preferably characterized by charge ordering of the 3d electrons of the perovskite manganese oxide thin film. That is, the perovskite manganese oxide thin film has 3d electrons that are charge ordered.

With this configuration, the charge ordering transition temperature ($T_\infty$) of the perovskite manganese oxide thin film of this aspect can be increased above that of the bulk crystal. In this configuration as well, the 3d electrons that are orbitally ordered are $e_g$ orbital electrons belonging to the $Mn^{3+}$ valence state as represented by nominal valence for example.

Moreover, in the perovskite manganese oxide thin film of this aspect of the present invention the substrate on which the perovskite manganese oxide thin film is formed is preferably a (210) plane perovskite single crystal. That is, the substrate is a perovskite single crystal having a (210) orientation.

A (210) plane perovskite single crystal substrate here means a perovskite single crystal substrate in which the film deposition surface is a (210) plane. This configuration allows for epitaxial growth using the substrate orientation in this aspect of the present invention, thereby facilitating preparation of a (210) oriented single-crystal thin film of a perovskite manganese oxide.

Moreover, in the perovskite manganese oxide thin film of this aspect of the present invention the substrate on which the perovskite manganese oxide thin film is formed is preferably annealed at a set temperature of 1100° C. in atmosphere prior to thin film formation. That is, the substrate is an annealed substrate that has been annealed at a set temperature of 1100° C. in ambient atmosphere prior to thin film formation.

With this configuration, it is possible to obtain a substrate surface defined by steps with a maximum height of about 0.5 nm and flat terraces at the atomic layer level in this aspect of the present invention, and to obtain a perovskite manganese oxide thin film having a surface planarized to about the same degree at the atomic layer level.

All aspects of the present invention provide a perovskite manganese oxide thin film in which the transition temperature to the charge-ordered phase or orbital-ordered phase is elevated to room temperature or above.

BRIEF DESCRIPTION OF THE DRAWINGS

FIG. 3 is a schematic side view showing the inclination of a crystal lattice grown with a (210) orientation in a cubic perovskite structure of one embodiment of the present invention. FIG. 3A is aside view looking towards the in-plane (1-20) axis, and FIG. 3B is a side view looking towards the in-plane [001] axis;

FIG. 4 is an enlarged view of one part of the crystal lattice in a cubic perovskite structure using a (210) orientation in one embodiment of the present invention, and FIG. 4 is drawn facing towards the in-plane [001] axis;

FIG. 5 is a horizontal cross-section showing the atomic arrangement of atomic layers in the plane of the substrate in the crystal lattice of a substrate and perovskite manganese oxide thin film in one embodiment of the present invention, shown for two planes parallel to the substrate plane and thin film surface.

FIG. 6 shows AFM images of the surfaces of substrates (LSAT (210) substrates) of examples used in an embodiment of the present invention. The substrates in FIGS. 6A to 6C have been annealed at temperatures of 1000° C.

FIG. 8 shows measurement results for the reflection points (211) and (310);

DETAILED DESCRIPTION OF THE INVENTION

Figure 1:
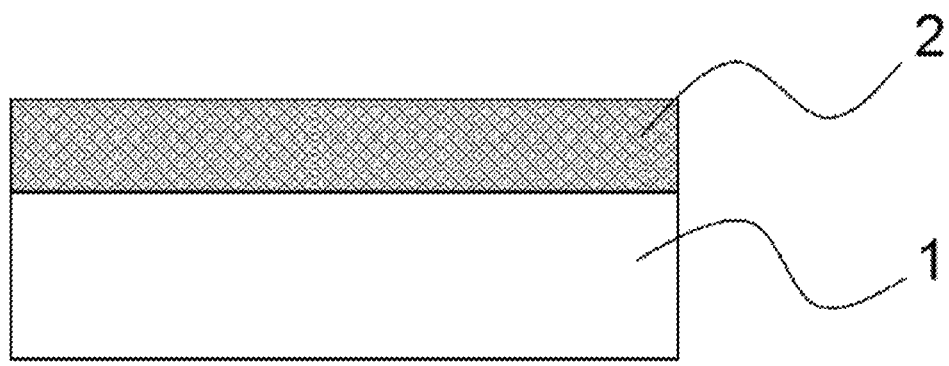
FIG. 1 is a schematic cross-section of a perovskite manganese oxide thin film formed on a substrate of one embodiment of the present invention.

Embodiments of the perovskite manganese oxide thin film of the present invention are explained below Unless specifically mentioned in the explanations below, parts or elements that are common to all drawings are represented by the same symbols. In the drawings, the elements of the respective embodiments are not necessarily shown to the same scale.

First Embodiment

The example of a (210) orientation (corresponding to m=2) is mainly used in explaining the (m10) oriented perovskite manganese oxide thin film of this embodiment. Next, the surface flatness, crystal structure, orbital-ordered plane and transition temperature of specific films are explained using examples and comparative examples.

FIG. 1 shows a schematic cross-section of a perovskite manganese oxide thin film 2 (hereunder called "oxide thin film 2") formed on the surface of a substrate 1. In samples for measuring the properties of the oxide thin film 2, an electrode (not shown) of Au—Pd alloy is formed by sputtering on the thin film. This electrode is used in a four-terminal method for measuring the temperature dependence of electrical resistance or resistivity in order to investigate the transition temperature for the orbital-ordered phase ($T_{OO}$) and the transition temperature for the charge-ordered phase ($T_{CO}$) or the transition temperature for the charge- and orbital-ordered phase ($T_{COO}$) (in which orbital ordering and charge ordering occur simultaneously). In this embodiment, the transition temperature for the ferromagnetic phase ($T_C$) is investigated in addition to $T_{OO}$, $T_{CO}$ and $T_{COO}$. An LSAT substrate having a (210) surface for example (hereunder called an LSAT (210) substrate) is used as substrate 1.

The following four substances are for the oxide thin films 2 covered in this embodiment:

(1) $La_{0.7}Sr_{0.3}MnO_3$,
(2) $Pr_{0.48}Sr_{0.52}MnO_3$, (3) $Pr_{0.5}Ca_{0.5}MnO_3$, and
(4) $Pr_{0.65}Ca_{0.35}MnO_3$.

Figure 2A:
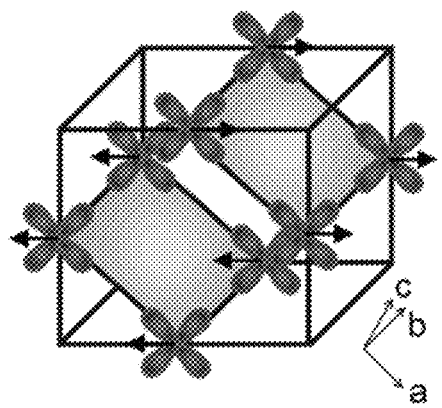
FIG. 2 is a diagram showing the spin and charge- and orbital-ordered phases in one aspect of the present invention, with FIG. 2A showing an A-type spin-ordered and orbital-ordered phase, and FIG. 2B showing a CE-type spin-ordered and charge- and orbital-ordered phase.
Figure 2B:
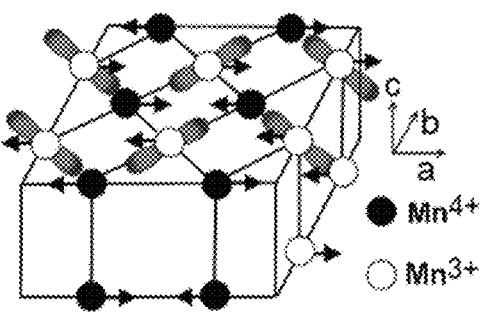

FIG. 2 illustrates spin ordering and charge and orbital ordering. FIG. 2A shows an orbital-ordered phase with a spin ordering called A-type, while FIG. 2B shows a charge- and orbital-ordered phase with a spin ordering called CE-type. In FIG. 2B, because there is no charge ordering, electron orbitals of the $3d(x^2-y^2)$ type (a kind of $e_g$ orbital) are shown in all of the Mn sites for reasons of convenience. By contrast, looking at the electron orbital of Mn atoms in FIG. 2B, the $Mn^{3+}$ $e_g$-orbital electrons, which affect the electron phase, are expressed by a schematic diagram using arrows indicating the $3d(3x^2-r^2/3y^2-r^2)$ type electron orbitals and spins. The directions of the a, b and c axes of the perovskite oxide are also shown.

Among the substances listed above, $La_{0.7}Sr_{0.3}MnO_3$ exhibits a ferromagnetic metallic phase. $Pr_{0.48}Sr_{0.52}MnO_3$ is an antiferromagnetic layered metal exhibiting an A-type spin ordering and a $3d(x^2-y^2)$ type orbital ordering. The shaded planes in FIG. 2A show the orbital-ordered planes. Furthermore, as shown in FIG. 2B, $Pr_{0.5}Ca_{0.5}MnO_3$, which has a higher compositional ratio of praseodymium (Pr), exhibits a CE-type spin ordering, a charge ordering characterized by a checkerboard alignment of $Mn^{3+}$ and $Mn^{4+}$ atoms, and a corresponding $3d(3x^2-r^2/3y^2-r^2)$ type orbital ordering. Finally. $Pr_{0.65}Ca_{0.35}MnO_3$ exhibits a spin ordering and charge- and orbital-ordering similar to those of $Pr_{0.5}Ca_{0.5}MnO_3$. However, $Pr_{0.65}Ca_{0.35}MnO_3$ has an even higher proportion of $Mn^{3+}$ than $Pr_{0.5}Ca_{0.5}MnO_3$, and has the property of metallizing more easily.

A-type spin ordering means that, as indicated by the arrows in FIG. 2, the spins in each atomic layer of charge- and orbital-ordered Mn atoms in FlG. 2 are arranged parallel to one another in the orbital-ordered plane of the atomic layer, and anti-parallel to the spins belonging to the Mn atomic layer in the adjacent orbital-ordered plane. By contrast, CE-type spin ordering means a spin ordering in which the spins are arranged in a zigzag pattern. That is, in CE-type spin ordering the spins of adjacent $Mn^{3+}$ ions are anti-parallel when viewed from one direction (the b-axial direction in FIG. 2B) and parallel when viewed from the other direction (a-axial direction in FIG. 2B) in an atomic layer containing Mn, and anti-parallel when viewed from the direction of the atomic layers containing Mn (c-axial direction in FIG. 2B). On the other hand, the adjacent $Mn^{4+}$ ions are all anti-parallel in the a-axial, b-axial and c-axial directions. However, the arrows in FIG. 2 are shown clearly to explain the spin ordering in terms of combinations of spins, and it should be noted that the actual spin directions of each electron may be different than those shown.

Next, the (210) oriented cubic perovskite structure used in this embodiment is explained with reference to FIG. 3. FIG. 3 is a schematic side view showing the inclination of the crystal lattice in a cubic perovskite structure grown with a (210) orientation. In this embodiment, because this cubic perovskite structure is a crystal structure assumed by both the substrate 1 and the oxide thin film 2 formed epitaxially on the substrate, it will be explained without loss of generality. Perovskite structures are generally described by $ABO_3$, with A occupying the apices, B the body center, and O (oxygen) the face centers in the cubic unit cells. In explaining this embodiment, the apex sites are called A sites and the atoms occupying them are called A atoms. The atoms occupying the body center B sites are likewise called B atoms. The perovskite structure explained in this embodiment is explained in terms of the cubic crystal shown in FIG. 3, but this is only to simplify the explanation. Perovskite structures included in this embodiment include not only cubic but also tetragonal, orthorhombic and monoclinic structures and the like, in which the aforementioned A, B and O atoms are arranged at any positions in a crystal lattice with any deformations. Also, for example substances with crystal structures in which the basic unit lattice is only obtained by linking a plurality of the unit cells discussed above are also included in this embodiment.

In FIG. 3, the up-down direction in the figure as seen on the paper surface is the thin-film growth direction ([210] axis; hereunder called the "direction perpendicular to the plane"), and the substrate plane and thin film plane perpendicular to this ((210) plane, or in other words the plane including the [1-20] and [001] axial directions) extend to the left and right in the figure. FIGS. 3A and 3B show a side view of a unit cell looking toward the in-plane [1-20] axis (FIG. 3A) and a side view of a unit cell looking toward the in-plane [001] axis (FIG. 3B).

The angle of the (100) plane relative to the substrate plane, or in other words the angle θ of the (210) plane from the (100) plane without inclination, is about 26.56 degrees as given by Formula 1. In the substrate 1 or oxide thin film 2, the atomic planes are stacked in an alternating pattern of $AO-BO_2AO$ . . . in the direction perpendicular to the plane. In the case of an LSAT (210) substrate, the lattice spacing of the (210) planes perpendicular to the plane is given by: d(210)=a·sin θ (Formula 2). Substituting 26.56 degrees for θ and 0.387 nm for a gives 0.173 nm as d(210). Considering that the unit cells of the cubic crystal are inclined 26.56 degrees from the (100) orientation, the spacing perpendicular to the surface is 3d(210) or 0519 nm. FIG. 3A shows an example of the spacing represented by d(210) and 3d(210). Considering also the periodicity of the in-plane atomic positioning, the length perpendicular to the surface is 5d(210) or 0.865 nm.

Next, the principles that allow both a first order phase transition and an elevated transition temperature in an oxide thin film 2 using a (210) orientation are explained. As explained in the context of prior art, a first order phase transition to a charge-ordered phase or orbital-ordered phase requires a kind of lattice deformation called Jahn-Teller deformation. An oxide thin film using a (110) orientation differs from one using a (100) orientation in that the formed thin film permits shear deformation of the lattice during switching because the fourfold symmetry is broken. In other words, in a thin film using a (110) orientation a first order phase transition is achieved because lattice deformation is possible even in a single-crystal thin film with an in-plane crystal lattice fixed to the in-plane lattice of the substrate. Results for this (110) orientation suggest that a first order phase transition is possible because breaking the fourfold symmetry allows shear deformation.

The oxide thin film 2 using a (210) orientation of this embodiment is asymmetrical because not only the fourfold symmetry of the (100) plane orientation but also the twofold symmetry of the (110) orientation is lost with respect to the in-plane [1-20] axis. That is, it is thought that because centrosymmetry is effectively lost, a first order phase transition is possible in an oxide thin film 2 using a (210) orientation as it is in the case of a (110) orientation.

The possibility of an elevated transition temperature is explained next. In most (100) oriented perovskite Mn oxide thin films exhibiting charge- and orbital-ordered phases prepared on LSAT (100) substrates, the lattice constant at room temperature is changed by tensile strain from the substrate. Specifically, in the lattice spacing of such a perovskite Mn oxide thin film, the two axes in the orbital-ordered plane (in this case, the lattice in the plane of the thin film or d(010)=d (001)) are elongated in the same way as the lattice constants of the charge- and orbital-ordered phase of the bulk oxide at low temperatures, while the lattice constant between orbital-ordered planes (in this case, the lattice perpendicular to the thin film plane or d (100)) is the shortest. This is due to the effect of tensile strain from the LSAT substrate. This phenomenon is one in which the lattice constants in the perovskite Mn oxide thin film at room temperature are similar to the lattice constants of the charge- and orbital-ordered phase of the same oxide in bulk form at low temperatures. As a result, when a perovskite Mn oxide thin film is prepared on a LSAT (100) oriented substrate, the lattice constant of the (100) oriented perovskite Mn oxide thin film has a value suited to the charge- and orbital-ordered phase at room temperature due to substrate strain from this substrate. The inventor of this application believes that with such a mechanism, the lattice deformation due to substrate strain stabilizes the orbital ordering via Jahn-Teller interactions. It is thought that tensile strain from the substrate in the (100) plane serves to stabilize the charge- and orbital-ordered phase, thereby elevating the $T_{COO}$ of the thin film.

A case using a (110) oriented substrate is considered next. The orbital-ordered plane in a perovskite manganese oxide thin film exhibiting a (110) oriented charge- and orbital-ordered phase is the (100) plane or (010) plane. This orbital-ordered plane is inclined at an angle of about 45 degrees relative to the substrate plane. As a result, the effect on this orbital-ordered plane of the strain that expands the lattice parallel to the substrate plane is to elongate the lattice within the orbital-ordered plane while simultaneously elongating the lattice between orbital-ordered planes. However, while this tensile strain is operating, a compressive strain determined by Poisson's ratio is generated simultaneously in the direction of film thickness. This compression strain also affects the orbital-ordered plane. Specifically, this compression strain acts to compress the lattice in the orbital-ordered plane while simultaneously compressing the lattice between orbital-ordered planes. That is, it is thought that because the effect of lattice deformation within the orbital-ordered plane due to substrate strain that is seen with a (100) orientation is cancelled out and minimized with a (110) oriented substrate, the transition temperature is not much different from that of the bulk oxide.

By contrast, when using a (210) orientation, the angle of the orbital-ordered plane relative to the substrate plane is 26.56 degrees, smaller than with a (110) orientation, making orbital-ordered plane more nearly parallel to the substrate surface. Because of this, the effect of the lattice deformation in the orbital-ordered plane produced by substrate strain in a (210) oriented single-crystal thin film is not cancelled out as it is with a (110) orientation, and is therefore greater than with a (110) orientation, That is, it is thought that the transition temperature elevation effect expected with a (100) oriented thin film formed on a (100) oriented substrate is also manifested in a (210) oriented thin film formed on a (210) oriented substrate.

Once again, however, no switching phenomenon is manifested with a (100) orientation because the in-plane fourfold symmetry does not permit a first order phase transition. With a (210) orientation, however, it is thought that a first order phase transition accompanying lattice deformation is permitted because the in-plane symmetry is broken, and it is also possible to exploit the lattice deformation and stabilization of the charge- and orbital-ordered phases caused by substrate strain as with a (100) orientation.

A first order phase transition and an elevated transition temperature can both be achieved simultaneously according to this principle with a (210) orientation. Of course, this principle is also applicable to cases of (m10) plane orientation in which m>2. The ease of the first order phase transition and the degree of elevation of the transition temperature are dependent on this plane index.

Figure 5A:
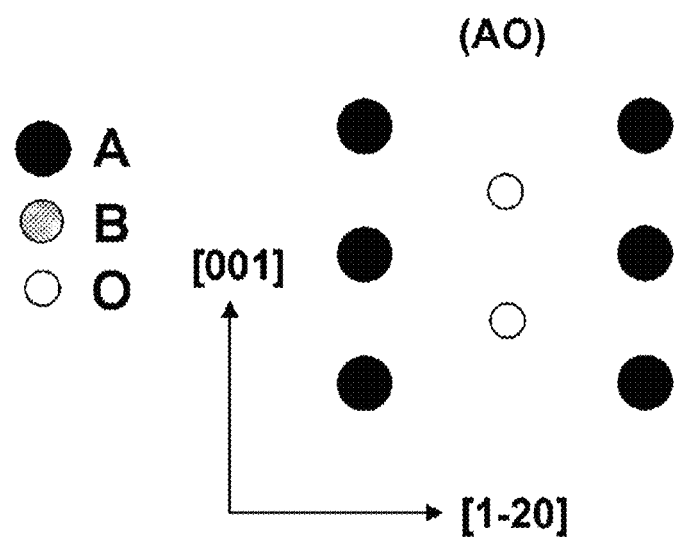
FIG. 5A is a cross-section on a plane containing A-site atoms and O (oxygen) atoms.
Figure 5B:
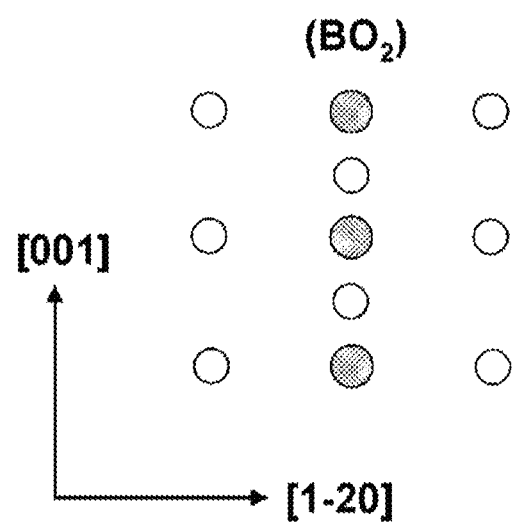
FIG. 5B is a cross-section on a plane containing B-site atoms and O atoms.

FIG. 4 is an enlarged view of one part of the crystal lattice in a cubic perovskite structure using a (210) orientation in an embodiment of the present invention. FIG. 4 is drawn facing towards the in-plane [001] axis. FIG. 5 is a horizontal cross-section showing the atomic arrangement of the atomic layers in the plane of the substrate in the crystal lattice of the substrate 1 and oxide thin film 2, with respect to the substrate plane and two planes parallel to the thin film surface. Of these, FIG. 5A is a cross-section of a plane containing A atoms and O (oxygen atoms), or in other words an AO layer, while FIG. 5B is a cross-section of a plane containing B atoms and O atoms, or in other words a $BO_2$ layer. The positions of each cross-section are shown clearly in FIG. 4. In both FIGS. 5A and 5B, the up-down direction as seen on the paper surface is the in-plane [001] axis, while the right-left direction is the [1-20] axis.

As shown in FIG. 4, when using a (210) orientation, all the atomic layers of the substrate 1 and oxide thin film 2 are composed of AO layers and $BO_2$ layers. These atomic layers are separated from each other by only a distance equal to ½ d(210), which is the shortest length period in the direction perpendicular to the plane as explained above. In these atomic layers, as shown in FIGS. 5A and 56, while the lattice spacing in the direction of the in-plane [001] axis is identical to the lattice spacing using a (100) plane as the growth plane, the lattice spacing in the direction of the in-plane [1-20] axis is greater than when using a (100) plane.

Examples and Comparative Examples

Next, the present invention is explained in more detail using examples prepared in accordance with the embodiments discussed above. The materials, amounts, proportions, processes, procedures and the like given in the following examples can be altered as necessary as long as the intent of the invention is not violated. Thus, the scope of the present invention is not limited to the following specific examples. The materials of the oxide thin films 2 prepared in the examples are:

$La_{0.7}Sr_{0.3}MnO_3$ (Example 1), $Pr_{0.8}Sr_{0.52}MnO_3$ (Example 2), $Pr_{0.5}Ca_{0.5}MnO_3$ (Example 3), and $Pr_{0.65}Ca_{0.35}MnO_3$ (Example 4).

The substrate treatments and film-fabrication processes common to these examples are explained first, and measurement results for each example are explained next.

First, an LSAT (210) substrate was prepared as the substrate 1. As-prepared LSAT (210) substrate does not have a stepped surface unlike in the case of a stepped (100) substrate. In fact, when the surface of a $SrTiO_3$ (210) substrate 1 was observed by AFM (atomic force microscopy), the surface was confirmed to be flat at a nm level and no atomic steps and terraces or other regular structures were observed. Usually, on a $SrTiO_3$ substrate with (100) or (110) orientation a surface exhibiting steps and terraces is obtained even without stepping treatment under the film-growth conditions for the perovskite manganese oxide thin film (substrate temperature 800 to 900° C., oxygen partial pressure 0.1 to 10 mTorr ($1.3 \times 10^{-2}$ to 1.3 Pa)). However, no such surface was observed with the LSAT (210) substrate 1. As discussed above, the inventor believes this is because it is more difficult to specify the surface in the direction perpendicuiar to the plane with a (210) plane than with a (100) or (110) plane.

Therefore, with the aim of obtaining regular structures accompanied by surface planarization, as-prepared LSAT (210) substrate samples were annealed in atmosphere and used as the substrate 1 in the examples. The conditions for annealing were determined in advance by fixing the annealing time and varying the set temperature of the annealing furnace (annealing temperature). Specifically, the annealing time was fixed at 12 hours, and the annealing temperature was varied from 1000° C. to 1100° C. and 1150° C. for each sample, The surface of each substrate sample was observed after annealing at each temperature. The results are shown in FIG. 6.

Figure 6A:
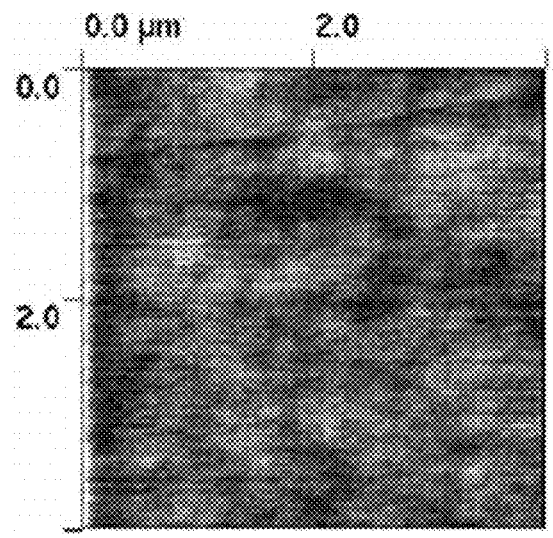
(FIG. 6A), 1100° C.
Figure 6B:
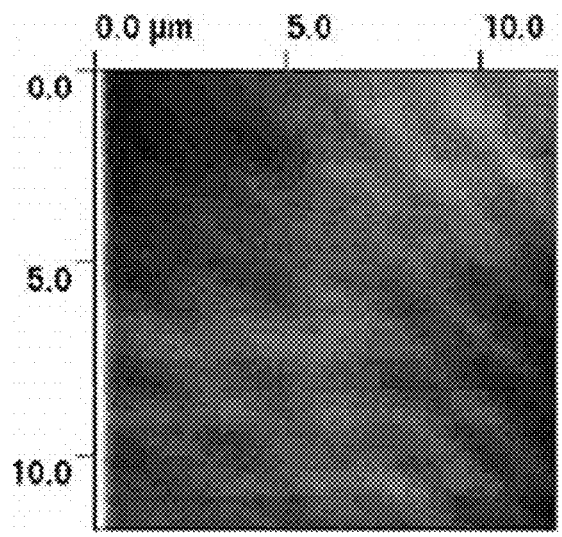
(FIG. 6B) and 1150° C.
Figure 6C:
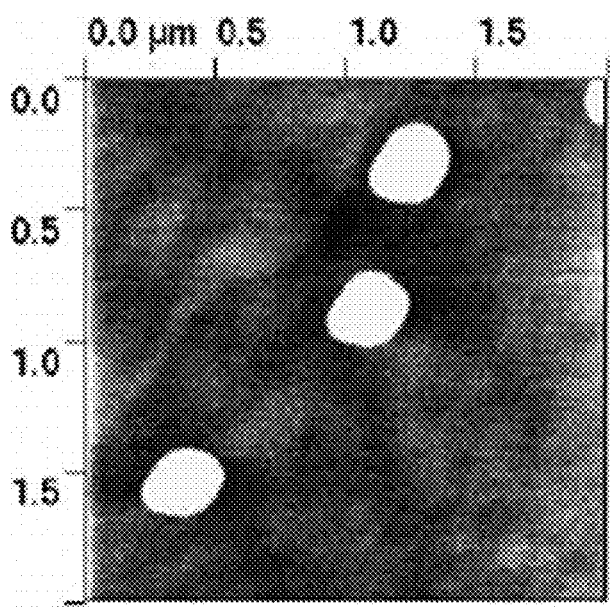
(FIG. 6C), respectively.

As shown in FIG. 6, there was no change in the surface structure of the substrate sample that was treated at 1000° C. (FIG. 6A). However, regular structures in the form of steps and terraces were formed when the substrate was annealed at 1100° C., and the terrace regions were shown to be planarized at the atomic layer level (FlG. 6B). The atomic layer step in the direction perpendicular to the (210) plane was extremely small at $(½)d(210)=0.087$ nm, but since annealing causes step bunching, it is thought that steps were formed of 0.519 nm (corresponding to $3d(210)$) and 1.038 nm (corresponding to $6d(210)$). Annealing at 1150° C. produced precipitates in the substrate sample (FIG. 6C). Based on this preliminary research, the optimal substrate annealing temperature was set at 1100° C., and a substrate that had been treated under these conditions was used as the surface planarizal substrate 1, As discussed below in the context of RHEED observation during thin film growth, the effect of suppressing facets that occur during the initial stage of thin film growth is achieved by using an annealed substrate.

Next, the preparation of a $Pr_{0.5}Ca_{0.5}MnO_3$ thin film is used as an example of the laser ablation film-fabrication technique used in the examples. A polycrystalline material prepared by a solid-phase reaction method was used as the target. The target was a $\phi$ 20 mm×5 mm cylindrical molded target. An LSAT (210) substrate as the substrate 1 and the aforementioned target were mounted inside a vacuum chamber, which was then evacuated to $3×10^{-9}$ Torr ($5.3×10^{-7}$ Pa) or less, Highly pure oxygen gas was then introduced to a partial pressure of 1 mTorr ($1.3×10^{-1}$ Pa), and the substrate 1 was heated to 900° C. under these conditions. The carbon, hydrates and the iike that were adsorbed on the substrate surface as a result of heating were removed, after which the substrate temperature was set at 800° C. and the oxygen partial pressure was adjusted to 0.2 mTorr ($2.7×10^{-2}$ Pa) as the film-fabrication conditions.

Figure 7:
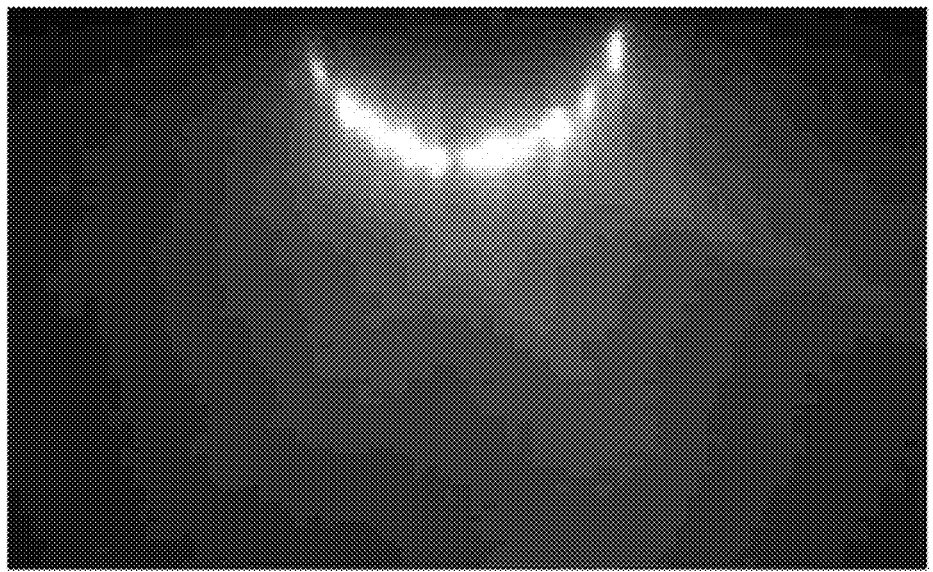
FIG. 7 shows the RHEED pattern of a $Pr_{0.5}Ca_{0.5}MnO_3$ thin film explained in one embodiment of the present invention, and the electron beam is directed parallel to the in-plane [001] axis.

Once the pressure had been controlled, the target was exposed at a pulse rate of 1 or 2 Hz with a 248 nm wavelength KrF excimer laser at 90 mJ power through the vacuum chamber's laser beam entry port, to thereby fabricate a $Pr_{0.5}Ca_{0.5}MnO_3$ thin film with a film thickness of 20 to 50 nm. The film thickness was controlled by adjusting the pulse number of the laser. During thin film growth, the fiim formation surface was observed in situ by RHEED. Using RHEED, because the (210) substrate is anisotropic, diffraction for the (1-20) plane can be obtained by directing the electron beam parallel to the in-plane [001] axis. Similarly, information about the (001) plane can be obtained by directing the beam parallel to the in-plane [1-20] axis. As discussed in the context of substrate surface planarization, if the electron beam is directed parallei to the in-plane [001] axis using a substrate that has not been annealed, a wedge-shaped pattern is observed indicating facet formation at the initial stage of growth (about 50 pulses). Once a few layers (total) had been deposited, or in other words once about 120 pulses had been completed, a RHEED pattern of Lane spots and streaks was observed. By contrast, growth without facet formation was achieved with the substrate that had been annealed at 1100° C. As in the case of the (100) oriented substrate, a RHEED pattern of Laue spots and streaks was observed when the electron beam was directed parallel to the in-plane [1-20] axis, regardless of whether the substrate had been annealed, and epitaxial growth of a flat thin film at the nm level was confirmed on the substrate. With the $Pr_{0.5}Ca_{0.5}MnO_3$ thin film, a RHEED pattern consisting solely of Laue spots and Kikuchi lines as shown in FIG. 7 was obtained when the electron beam was directed parallel to the [001] axis, and an ultra-flat and highly crystalline film was obtained. After thin film growth, a flat surface at the atomic layer level was confirmed by AFM observation.

Figure 8:
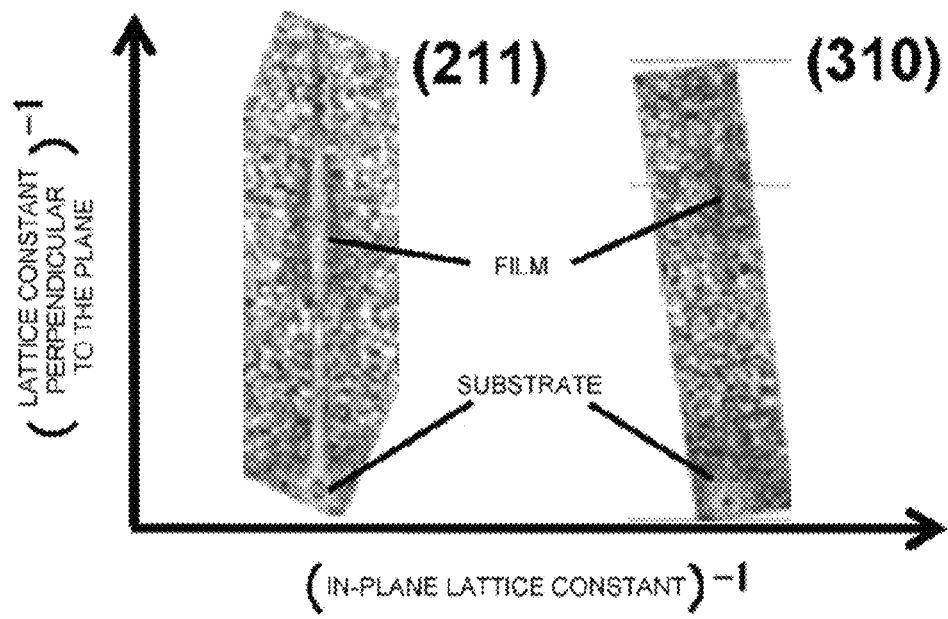
FIG. 8 is a reciprocal lattice space mapping of a $Pr_{0.5}Ca_{0.5}MnO_3$ thin film explained in one embodiment of the present invention.

Next, the fabricated thin film was subjected to reciprocal lattice space mapping measurement. This measurement was performed by 4-circle X-ray diffraction, mapping around (211) and (310). FIG. 8 shows the results of reciprocal lattice space mapping. As shown in the figure, the in-plane lattice spacing in the fabricated oxide thin film 2 matched that of the substrate on both the [001] axis and [1-20] axis, showing that the oxide thin film 2 was grown coherently on substrate 1 as a single-crystal thin film. The reflection peak was also similar to that obtained from the substrate, confirming that the oxide thin film 2 exhibited superior crystallinity.

Thus, the perovskite manganese oxide thin film 2 fabricated on an LSAT (210) substrate (substrate 1) in each example was confirmed to have a flat surface on the atomic layer level, without misfits or other defects, and to be a (210) oriented single-crystal thin film grown coherently on the substrate 1.

Next, the transition temperatures were measured in the oxide thin films 2, which are (210) oriented single-crystal thin films of perovskite manganese prepared as described above, and the results are explained for each example.

Figure 9:
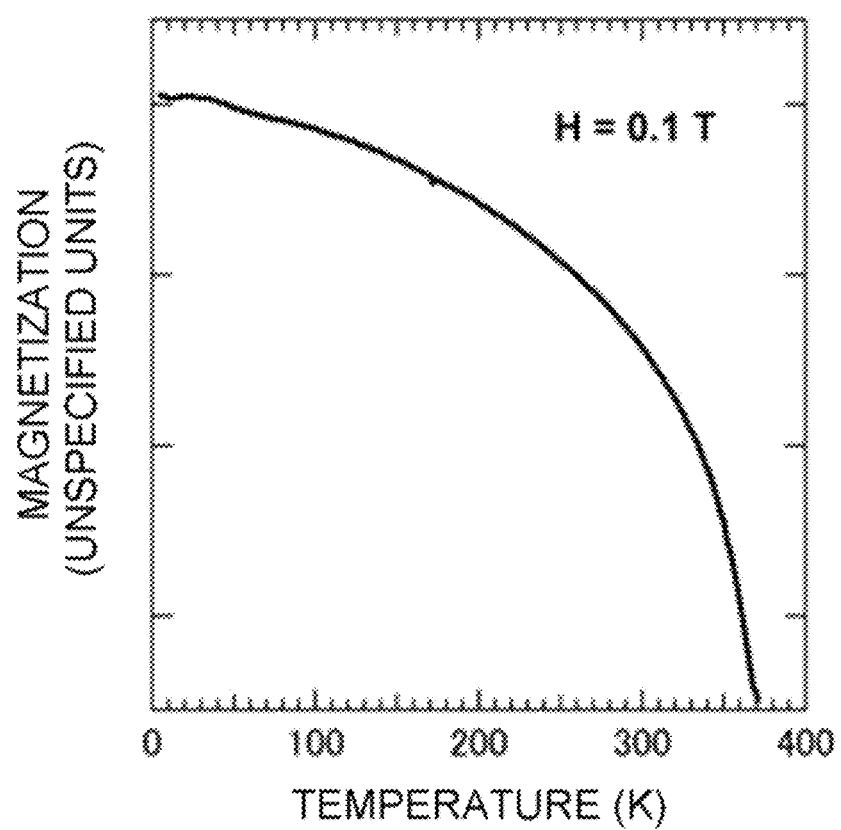
FIG. 9 is a graph showing measurement results for temperature dependence of magnetization of a $La_{0.7}Sr_{0.3}MnO_3$ thin film (Example 1) explained in one embodiment of the present invention.

First, the ferromagnetic transition temperature of $T_C$ of $La_{0.7}Sr_{0.3}MnO_3$, which exhibits a ferromagnetic metallic phase, was investigated using Example 1 and some comparative examples. FIG. 9 is a graph showing temperature dependence of magnetization for the $La_{0.7}Sr_{0.3}MnO_3$ of Example 1. For purposes of comparison, the same measurement was performed on single-crystal thin films prepared using the same material ($La_{0.7}Sr_{0.3}MnO_3$) on LSAT substrates with a different plane orientation as comparative examples, and on a bulk single crystal as another comparative example (both not shown). When an 0.1 T magnetic field was applied to Example 1, and the temperature dependence of magnetization was measured in the range of 5 to 380 K, the $T_C$ was 370 K. Because the $T_C$ of a bulk single crystal of $La_{0.7}Sr_{0.3}MnO_3$ was 360 K, this confirmed that in the (210) oriented single-crystal thin film of Example 1, the $T_C$ was higher than that of the bulk crystal (FIG. 9). In the (100) and (110) oriented single-crystal thin films of the comparative examples, which were fabricated under similar film-forming conditions as in Example 1 on (100) and (110) oriented substrates, the $T_C$ was about 310 K. That is, the $T_C$ confirmed in Example 1 was 70 K higher than those in these comparative examples.

The inventor supposes that these experimental results were obtained for reasons such as the following. Originally, the crystal lattice of $La_{0.7}Sr_{0.3}MnO_3$ has relatively small lattice mismatches with LSAT. A detailed comparison of the lattice constants of the two reveals that compression strain acts on the crystal lattice of $La_{0.7}Sr_{0.3}MnO_3$. In the comparative example using a (100) orientation, ferromagnetism is suppressed by this compressive strain. Similarly, in the comparative example using a (110) orientation, the lattice is distorted and the symmetry declines from orthorhombic to monoclinic or triclinic, thereby slightly narrowing the bandwidth and inhibiting the transition to a ferromagnetic phase. This phase transition inhibition makes the ferromagnetic transition temperatures $T_C$ much lower than that of the bulk crystal. However, in the (210) oriented single-crystal thin film fabricated on the (210) oriented substrate of Example 1, inclination of the (100) plane produces a suitable degree of compressive strain, resulting in an expansion of bandwidth and a $T_C$ elevation effect. That is, it is thought that the (210) orientation produces lattice deformation suited to the ferromagnetic metallic phase, thereby elevating the transition temperature in Example 1 above that of the bulk crystal.

Next, the results of an investigation into the $T_{OO}$ of the antiferromagnetic layered metal $Pr_{0.48}Sr_{0.52}MnO_3$, which exhibits A-type spin ordering and $3d(x^2-y^2)$ type orbital ordering, are explained using Example 2 and some comparative examples. Example 2 is a $Pr_{0.48}Sr_{0.52}MnO_3$ thin film grown on an LSAT (210) substrate. This substance is metallic concerning the conduction in the orbital-ordered plane because the spins are aligned in the orbital-ordered plane, and highly resistant concerning the conduction between planes because the spins are oppositely-oriented (antiferromagnetic) between planes. This difference in properties can be used to specify which of the planes is the orbital-ordered plane, That is, the direction of the orbital-ordered plane can be specified by measuring the anisotropy of in-plane resistivity. As discussed above, within a plane parallel to the substrate of the (210) oriented thin film in Example 2, symmetry at temperatures lower than $T_{OC}$ is broken by the effect of substrate strain. As a result, the three planes ((100) plane, (010) plane and (001) plane) included in the {100} plane group, which were equivalent in a cubic crystal retaining symmetry, can no longer be called equivalent in Example 2. In Example 2, all of these planes are candidates for the orbital-ordered plane.

Figure 10:
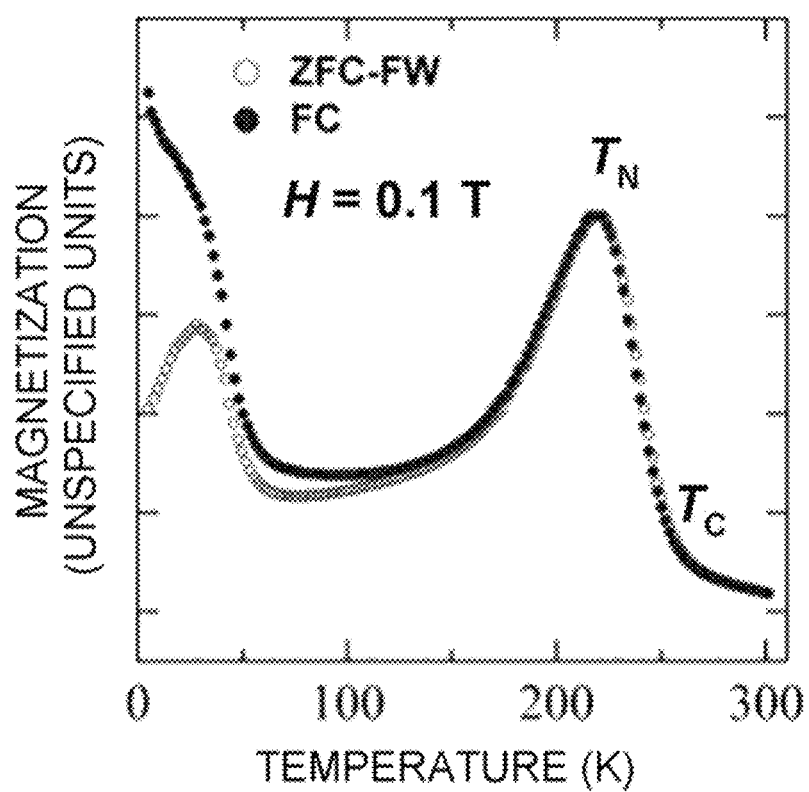
FIG. 10 is a graph showing temperature dependence of magnetization of a $Pr_{0.48}Sr_{0.52}MnO_3$ thin film (Example 2) explained in one embodiment of the present invention.

First, the antiferromagnetic transition temperature $T_N$ and the anisotropy between the direction of [001] axis and direction of [1-20] axis were investigated in the $Pr_{0.48}Sr_{0.52}MnO_3$ thin film of Example 2. FIG. 10 shows the temperature dependence of magnetization in Example 2. The ZFC-FW and FC shown in the figure indicate magnetic field application protocols. ZFC-FW is a protocol that consists of cooling from 301 K in a zero field, applying a magnetic field (0.1 T) at 5 K, and then measuring as the temperature is raised, while FC is a protocol that consists of applying a magnetic field at 301 K, and then measuring while cooling. As shown in FIG. 10, based on the temperature dependence of magnetization the antiferromagnetic transition temperature $T_N$ is about 220 K. That is, the antiferromagnetic transition temperature $T_N$ of the thin film of Example 2 is higher than the antiferromagnetic transition temperature $T_N$ (180 K) of a bulk crystal of $Pr_{0.48}Sr_{0.52}MnO_3$. The increase in magnetization at 50 K and below can be ignored because it is coming from the substrate.

Figure 11A:
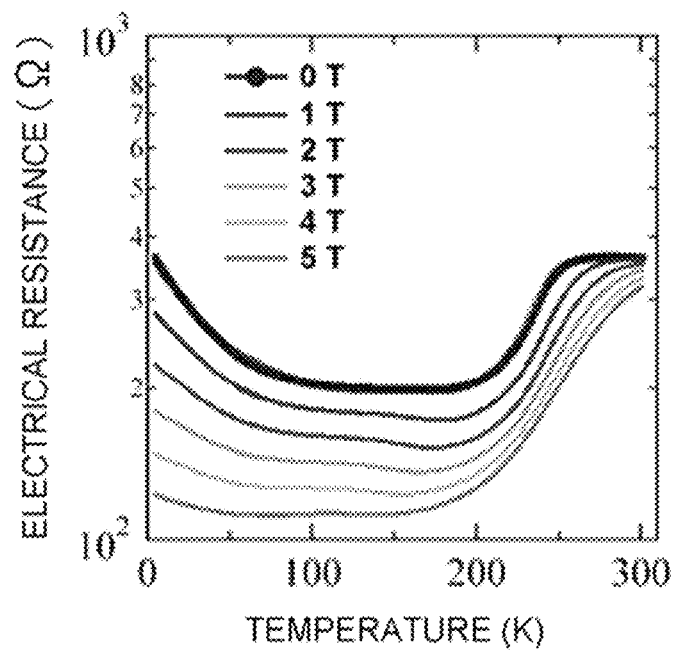
FIG. 11 is a graph showing temperature dependence of electrical resistance of a $Pr_{0.48}Sr_{0.52}MnO_3$ thin film explained in one embodiment of the present invention, and the measurement results in the direction [001] axial are shown in FIG. 11A, and those in the [1-20] axial direction in FIG. 11B.

Next, the temperature dependence of electrical resistance in the $Pr_{0.48}Sr_{0.52}MnO_3$ thin film of Example 2 was investigated in order to distinguish the anisotropy of electrical conduction. FIG. 11A shows the temperature dependence of electrical resistance in the axis direction (up-down direction on the paper surface in FIG. 5). Measurement was performed in the range of 5 to 301 K in magnetic fields of 0, 1, 2, 3, 4 and 5 T. As the temperature drops, electrical resistance decreases beginning at 250 K with the ferromagnetic transition, corresponding to temperature dependence of magnetization (FIG. 10), and the decrease in electrical resistance stops near about 220 K, which was measured as the antiferromagnetic transition temperature. That is, an orbital-ordered phase of aligned electron orbitals was achieved. Thus, the orbital ordering transition temperature $T_{OO}$ in the thin film of Example 2 seems to be about 220 K. The resistance value is low (1 kΩ or less) at all temperature ranges, and metallic behavior is evident if the upturn at 50 K or less.

The next step was to determine what orbital-ordered plane can explain these results. Supposing that the orbital-ordered plane is the (001) plane, the electrical resistance in the direction of [001] axis will be brought about by conduction in the direction perpendicular to the orbital-ordered plane. However, the aforementioned measured resistance value of 1 kΩ or less is too low to be consistent with such conduction. Thus, this supposition is invalid. The remaining possibility is that the orbital-ordered plane is a plane tilted either at an angle of 26.56 degrees to the substrate plane, or at the supplementary angle of 63.5 degrees. These angles correspond to cases in which the orbital ordered plane is the (100) plane or the (010) plane, respectively. Therefore, the conduction characteristics in the [1-20] axis direction (left-right direction on paper surface in FIG. 5) were investigated.

Figure 11B:
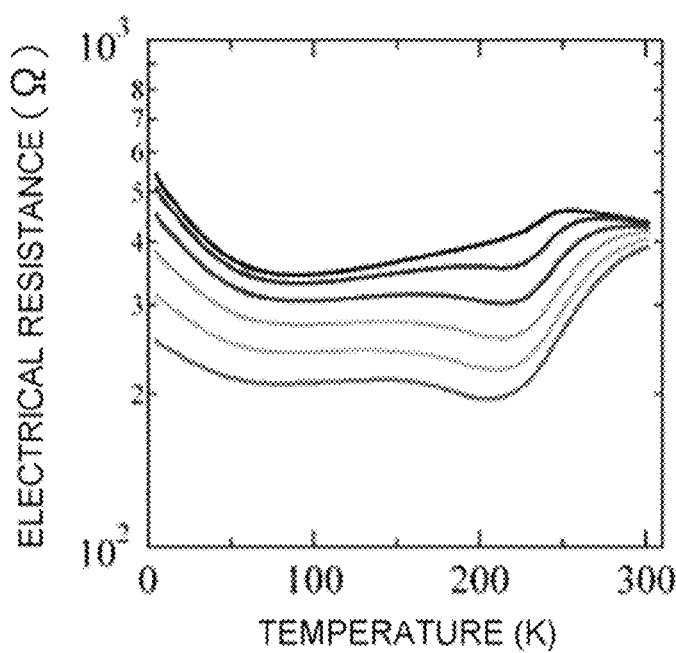
Figure 12:
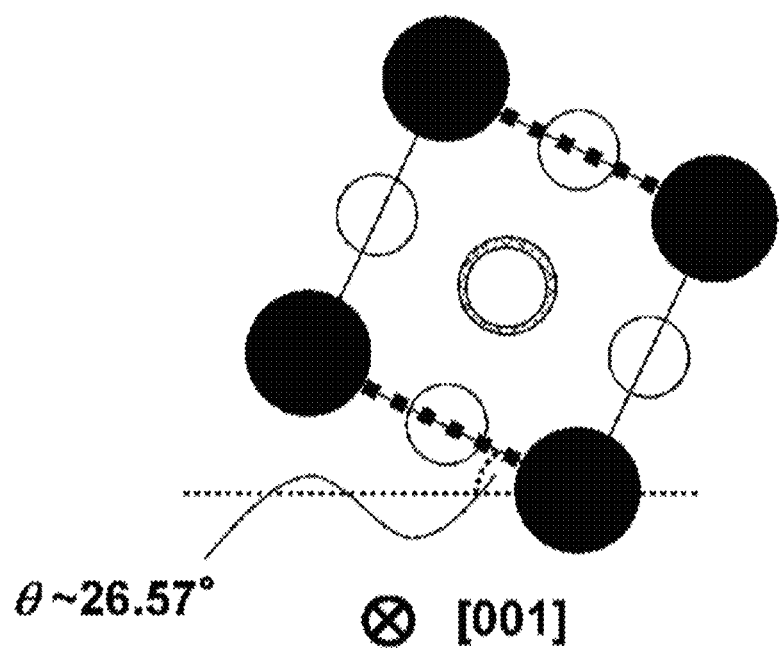
FIG. 12 is a view of the orbital-ordered plane (shown as a dotted line) of a (210) oriented perovskite manganese oxide thin film of an embodiment of the present invention, shown in side view facing towards the in-plane [001] axis.

FIG. 11B shows the temperature dependence of electrical resistance in the [1-20] axis direction of Example 2, measured in the range of 5 to 301 K in magnetic fields of 0, 1, 2, 3, 4 and 5 T. In some regions metallic behavior in evident in the direction of this axis as in the [001] axial direction, and the value is 1 kΩ or less at all temperatures. However, one notable feature is that the resistance values are slightly higher than those in the [001] axis direction. Supposing the orbital-ordered plane to be the 63.44 degree tilted plane, which has a large component perpendicular to the plane of the film, measurement in the [1-20] axial direction should mainly measure electrical resistance between orbital-ordered planes. However, the actual measurement values are lower than the resistance values that would be expected from measuring electrical resistance between orbital-ordered planes, Thus, this supposition is also judged to be invalid. This confirms that the plane inclined about 26.56 degrees to the substrate surface, or in other words the (100) plane, is the orbital ordered plane in the $Pr_{0.48}Sr_{0.52}MnO_3$ thin film of Example 2. In FIG. 12, the orbital ordered plane ((100) plane) is shown clearly as a dotted line. If the orbital-ordered plane is the (100) plane, the measurement results can be explained without contradiction because the [001] axis direction is included in the orbital-ordered plane, which is also consistent with the electrical resistance in this direction being lower than in the case of the [1-20] axis.

The $Pr_{0.48}Sr_{0.52}MnO_3$ material used in Example 2 has a smaller lattice constant and a greater mismatch with the LSAT substrate than the $La_{0.7}Sr_{0.3}MnO_3$ explained in Example 1. As a result, the $Pr_{0.48}Sr_{0.52}MnO_3$ is affected by tensile strain from the LSAT substrate. As explained before, a lattice constant suited to an orbital-ordered phase is provided by substrate strain in the crystal lattice of a single-crystal thin film of $Pr_{0.48}Sr_{0.52}MnO_3$ prepared using a (100) oriented substrate. This lattice constant is a lattice arrangement of orbital-ordered phases, in which the two axes in the orbital-ordered phase are long and the one axis between orbital-ordered phases is short. This is believed to be the reason for the stabilization of the orbital-ordered phase and the elevation of the transition temperature $T_{OO}$ in a single-crystal thin film of $Pr_{0.48}Sr_{0.52}MnO_3$ prepared on a (100) oriented substrate. Similarly, it is thought that in the (210) oriented single crystal of $Pr_{0.48}Sr_{0.52}MnO_3$ prepared in Example 2, the same stabilization of the orbital-oriented phase that is expected using a (100) plane is achieved because of the small inclination of the orbital-ordered plane relative to the substrate plane. Thus, the transition temperature is elevated and a first order phase transition is achieved because the in-plane symmetry in the (210) plane is broken.

Figure 13:
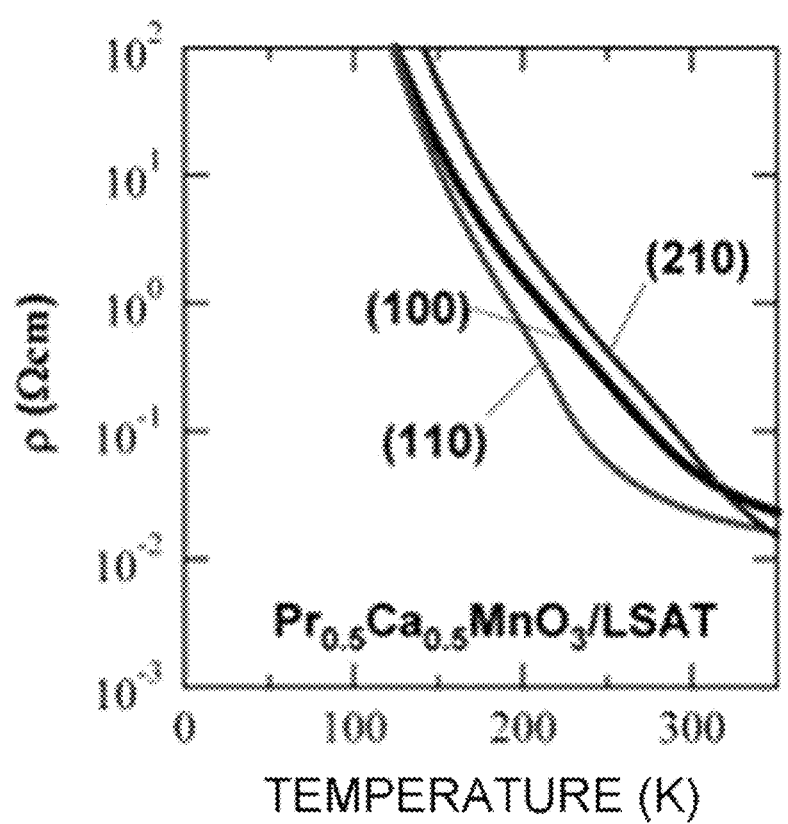
FIG. 13 is a graph showing temperature dependence of resistivity in the [001] axial direction in an embodiment of the invention, obtained from (100) and (110) oriented $Pr_{0.5}Ca_{0.5}MnO_3$ thin films and a (210) oriented $Pr_{0.5}Ca_{0.5}MnO_3$ thin film (Example 3)

Next, a thin film of $Pr_{0.5}Ca_{0.5}MnO_3$ was prepared on a LSAT (210) substrate as Example 3. This Example 3 is explained in contrast with comparative examples of thin films of $Pr_{0.5}Ca_{0.5}MnO_3$ prepared on substrates with different orientations, $Pr_{0.5}Ca_{0.5}MnO_3$ is a substance exhibiting CE-type spin ordering, charge ordering of $Mn^{3+}$ and $Mn^{4+}$ aligned in a checkerboard pattern, and consequent $3d(3x^2-r^2/3y^2-r^2)$ type orbital ordering. The charge- and orbital-ordering transition temperature $T_{COO}$ was investigated for Example 3 and related comparative examples. For purposes of comparison, $Pr_{0.5}Ca_{0.5}MnO_3$ thin films were prepared on LSAT substrates with (100), (110) and (210) orientations as two comparative examples and Example 3. These were single-crystal thin films with (100), (110) and (210) orientations grown coherently on the substrates, all having flat surfaces on the atomic layer level. FIG. 13 shows the temperature dependence of resistivity in the [001] axial direction for these three $Pr_{0.5}Ca_{0.5}MnO_3$ thin films.

In the (100) oriented thin film of one comparative example, there was no obvious change in resistance in conjunction with charge ordering, and there was only a slight change in activation energy near 290 K. In the (110) oriented thin film of the other comparative example, on the other hand, there was an obvious resistance change near 230 K, confirming the possibility of a first order phase transition. The $T_{CO}$ in the bulk single crystal is 240 K. In contrast with these comparative examples, a resistance change was observed at a temperature near 320 K in the (210) oriented thin film of Example 3, The temperature at which a resistance change was observed in Example 2 was 80 K higher than the transition temperature of the bulk single crystal, and was a value in excess of 300 K, which is often used as room temperature. This confirms that a first order phase transition is possible in Example 3 with the $Pr_{0.5}Ca_{0.5}MnO_3$ thin film formed on an LSAT (210) substrate, and that the phase transition temperature is about room temperature.

Finally, the $Pr_{0.65}Ca_{0.35}MnO_3$ single-crystal film fabricated on an LSAT (210) substrate of Example 4 is explained. This Example 4 was studied because the extreme stability of the charge- and orbital-ordered phase in the $Pr_{0.5}Ca_{0.5}MnO_3$ of Example 3 means that the magnetic resistance effects and the like could not be verified within the range of magnetic fields producing a magnetic flux density of 5 T. That is, assuming a declining transition temperature, the $Pr_{0.65}Ca_{0.35}MnO_3$ thin film of Example 4 was prepared in the expectation that the magnetic resistance effect could be confirmed in a magnetic field of 5 T. In Example 4 as well, a $Pr_{0.65}Ca_{0.35}MnO_3$ single-crystal film fabricated on a (110) oriented LSAT substrate was used as a comparative example.

Figure 14A:
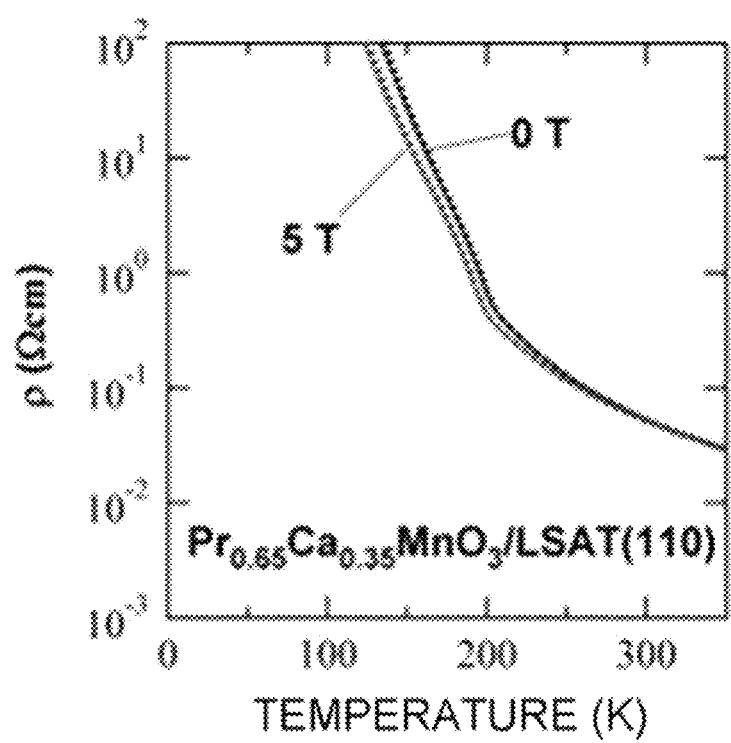
FIG. 14 is a graph showing temperature dependence of resistivity of a $Pr_{0.65}Ca_{0.35}MnO_3$ thin film of an embodiment of the present invention, and the results for a (110) oriented thin film are shown in FIG. 14A, and those for a (210) oriented thin film (Example 4) in FIG. 14B.
Figure 14B:
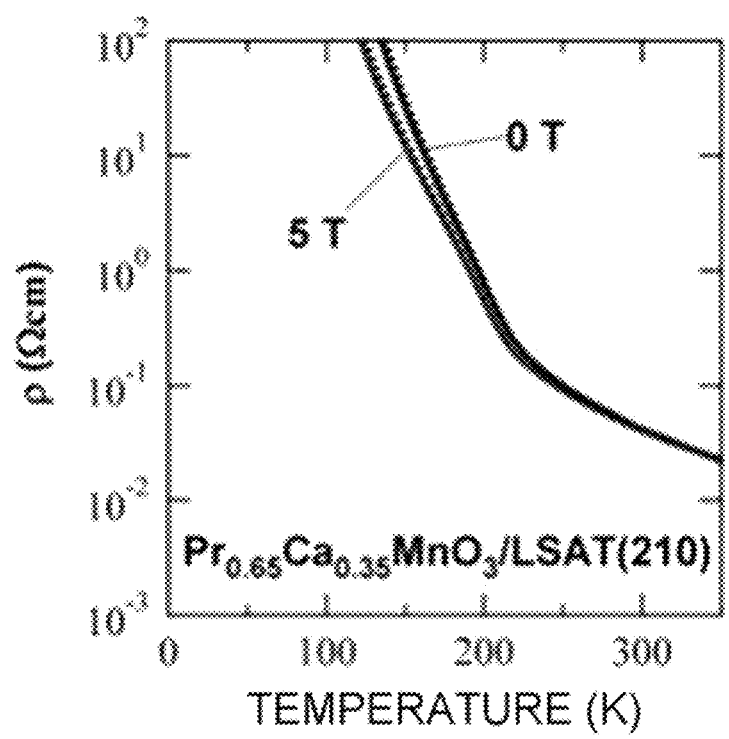

FIG. 14A shows the temperature dependence of electrical resistance of the (110) oriented single-crystal thin film of the comparative example, grown coherently on a substrate. The solid line in the figure indicates data with cooling, while the dotted line indicates data with heating. The transition temperature was about 200 K, and temperature hysteresis was also confirmed, with higher electrical resistance during heating than during cooling. A negative magnetic resistance effect was also confirmed whereby electrical resistance declined at the transition temperature or below due to application of a magnetic field producing a magnetic flux density of 5 T. FIG. 14B shows the temperature dependence of electrical resistance of the (210) oriented single-crystal thin film of Example 4, grown coherently on a substrate. Example 4 also exhibited a clear transition in the same way as the (110) oriented single-crystal thin film of the comparative example. However, in Example 4 the transition temperature was about 230 K, higher than that of the (110) oriented single-crystal thin film of the comparative example. Temperature hysteresis and a magnetic resistance effect were also confirmed in Example 4 as in the comparative example, evidence that a first order phase transition is possible as in the previous examples, and that a transition temperature elevation effect is obtained.

Of the materials of Examples 1 to 4 given here, the material of the thin film of Example 3 ($Pr_{0.5}Ca_{0.5}MnO_3$) has the smallest lattice constant, and the greatest lattice mismatch with the substrate. As a result, the effect of extension strain from the LSAT substrate is the greatest in Example 3. As explained previously in the context of $T_{OO}$ elevation, in a single-crystal film of $Pr_{0.5}Ca_{0.5}MnO_3$ on a (100) plane the substrate strain produces a lattice configuration in the charge- and orbital-ordered phase, or in other words lattice constants with values suited to the charge- and orbital-ordered phase, namely two long axes within the orbital-ordered plane and one short axis between the orbital-ordered planes. It is thought that for this reason, the charge-ordered phase and orbital-ordered phase are stabilized and the charge ordering transition temperature $T_{CO}$ is elevated in a single crystal film of $Pr_{0.5}Ca_{0.5}MnO_3$ on a (100) plane. Similarly, it is thought that in the case of a (210) oriented single crystal film, the same stabilization of the orbital-ordered phase is achieved as with a (100) plane. This is because in a single-crystal film of $Pr_{0.5}Ca_{0.5}MnO_3$ on a (210) plane, the inclination of the orbital-ordered plane is small. Of course, with a single-crystal film using a (100) plane no first order phase transition such as that shown in FIG. 13 and FIG. 14B is seen because the first order phase transition is suppressed. By contrast, in a single crystal film using a (210) plane a first order phase transition is achieved because the in-plane symmetry is broken, and the transition temperature is also elevated to room temperature or higher.

As explained above, it has been confirmed that it is possible to achieve a first order phase transition and an elevated transition temperature with a (210) oriented perovskite manganese oxide thin film. In particular, a transition temperature of room temperature or higher is achieved with $Pr_{0.5}Ca_{0.5}MnO_3$. Thus, in general, in an (m10) oriented (19≥m≥2) perovskite manganese oxide thin film, it should be possible to achieve a first order phase transition and it can be highly expected that the transition temperature is elevated above that of the bulk crystal.

The present invention can be used in a device using a perovskite manganese oxide thin film the electrical, magnetic and optical properties of which manifest phase transitions and switching phenomena in response to electrical fields, magnetic fields and light exposure.

Specific embodiments of the invention were explained above. The aforementioned embodiments and examples were described in order to explain the invention, which is not thereby limited to the thin film, the substrate materials, the compositions, the film thickness, the formation methods and the like described in the above embodiments. The scope of the invention of this application should be determined based on the descriptions of the claims. Modifications that are within the scope of the invention including other combinations of the respective embodiments are included in the scope of the claims.

The invention claimed is:
1. An article comprising:
a substrate; and a perovskite manganese oxide thin film formed on the substrate and having an orientation that is a (m10) orientation where 19≥m≥2.

2. The article according to claim 1, wherein the perovskite manganese oxide thin film exhibits a ferromagnetic metallic phase.

3. The article according to claim 1, wherein the perovskite manganese oxide thin film has 3d electrons that are orbitally ordered.

4. The article according to claim 1, wherein the perovskite manganese oxide thin film has 3d electrons that are charge ordered.

5. The article according to claim 1, wherein the substrate is a perovskite single crystal having a (210) orientation.

6. The article according to claim 5, wherein the substrate is an annealed substrate that has been annealed at a set temperature of 1100° C. in ambient atmosphere prior to thin film formation.

7. The article according to claim 1, wherein the perovskite manganese oxide thin film is represented by a chemical formula $La_{0.7}Sr_{0.3}MnO_3$.

8. The article according to claim 1, wherein the perovskite manganese oxide thin film is represented by a chemical formula $Pr_{0.48}Sr_{0.52}MnO_3$.

9. The article according to claim 1, wherein the perovskite manganese oxide thin film is represented by a chemical formula $Pr_{0.5}Ca_{0.5}MnO_3$ or $Pr_{0.65}Ca_{0.35}MnO_3$.

10. The article according to claim 5, wherein the substrate is a LSAT substrate.

11. An article comprising:
a substrate; and
a perovskite manganese oxide thin film formed on the substrate and having an orientation that is a (210) orientation.

12. The article according to claim 11, wherein the perovskite manganese oxide thin film exhibits a ferromagnetic metallic phase.

13. The article according to claim 11, wherein the perovskite manganese oxide thin film has 3d electrons that are orbitally ordered.

14. The article according to claim 11, wherein the perovskite manganese oxide thin film has 3d electrons that are charge ordered.

15. The article according to claim 11, wherein the substrate is a perovskite single crystal having a (210) orientation.

16. The article according to claim 15, wherein the substrate is an annealed substrate that has been annealed at a set temperature of 1100° C. in ambient atmosphere prior to thin film formation.

17. The article according to claim 15, wherein the substrate is a LSAT substrate.

18. The article according to claim 11, wherein the perovskite manganese oxide thin film is represented by a chemical formula $La_{0.7}Sr_{0.3}MnO_3$.

19. The article according to claim 11, wherein the perovskite manganese oxide thin film is represented by a chemical formula $Pr_{0.48}Sr_{0.52}MnO_3$.

20. The article according to claim 11, wherein the perovskite manganese oxide thin film is represented by a chemical formula $Pr_{0.5}Ca_{0.5}MnO_3$ or $Pr_{0.65}Ca_{0.35}MnO_3$.

* * * * *